United States Patent
Shima

(10) Patent No.: US 9,123,742 B2
(45) Date of Patent: *Sep. 1, 2015

(54) SEMICONDUCTOR DEVICE AND METHOD FOR MANUFACTURING SEMICONDUCTOR DEVICE

(71) Applicant: FUJITSU SEMICONDUCTOR LIMITED, Yokohama-shi (JP)

(72) Inventor: Masashi Shima, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 257 days.

This patent is subject to a terminal disclaimer.

(21) Appl. No.: 13/783,299

(22) Filed: Mar. 3, 2013

(65) Prior Publication Data
US 2013/0178032 A1    Jul. 11, 2013

Related U.S. Application Data

(62) Division of application No. 13/451,535, filed on Apr. 19, 2012, now abandoned, which is a division of application No. 12/882,038, filed on Sep. 14, 2010, now Pat. No. 8,841,725.

(30) Foreign Application Priority Data

Sep. 15, 2009   (JP) ................. 2009-213189

(51) Int. Cl.
*H01L 21/336*   (2006.01)
*H01L 29/66*   (2006.01)
(Continued)

(52) U.S. Cl.
CPC .. *H01L 29/66492* (2013.01); *H01L 21/823412* (2013.01); *H01L 21/823418* (2013.01);
(Continued)

(58) Field of Classification Search
CPC .................. H01L 29/66492; H01L 29/66659; H01L 21/823412; H01L 27/0922; H01L 21/823418; H01L 29/7835; H01L 29/1045
USPC .................. 438/286, 316; 257/344, 408, 336, 257/E21.437, E29.268
See application file for complete search history.

(56) References Cited

U.S. PATENT DOCUMENTS 4,291,321 A    9/1981   Pfleiderer et al.
4,342,149 A    8/1982   Jacobs et al.
(Continued)

FOREIGN PATENT DOCUMENTS

JP    H06-310717    11/1994
JP    H10-116983    5/1998
(Continued)

OTHER PUBLICATIONS

Japanese Office Action mailed Jul. 23, 2013 for corresponding Japanese Application No. 2009-213189, with Partial English-language Translation.
(Continued)

*Primary Examiner* — David Vu
(74) *Attorney, Agent, or Firm* — Fujitsu Patent Center

(57) ABSTRACT

A method for manufacturing a semiconductor device includes forming a first gate electrode on a semiconductor substrate in a first transistor region; forming a channel dose region; and forming a first source extension region, wherein the channel dose region is formed by using a first mask as a mask and by ion-implanting a first dopant of the first conductivity type, and the first mask covering a drain side of the first gate electrode and covering a drain region, and the first source extension region is formed by using a second mask and the gate electrode as masks and by ion-implanting a second dopant of a second conductivity type that is a conductivity type opposite to the first conductivity type, the second mask covering the drain side of the first gate electrode and covering the drain region.

4 Claims, 6 Drawing Sheets

(51) Int. Cl.
*H01L 21/8234* (2006.01)
*H01L 21/8238* (2006.01)
*H01L 27/092* (2006.01)
*H01L 29/10* (2006.01)
*H01L 29/78* (2006.01)
*H01L 21/265* (2006.01)
*H01L 29/45* (2006.01)
*H01L 29/49* (2006.01)

(52) U.S. Cl.
CPC *H01L 21/823807* (2013.01); *H01L 21/823814* (2013.01); *H01L 27/0922* (2013.01); *H01L 29/1045* (2013.01); *H01L 29/66477* (2013.01); *H01L 29/66659* (2013.01); *H01L 29/7835* (2013.01); *H01L 21/26586* (2013.01); *H01L 29/456* (2013.01); *H01L 29/4933* (2013.01); *H01L 29/665* (2013.01)

(56) References Cited

U.S. PATENT DOCUMENTS

| | | | |
|---|---|---|---|
| RE32,800 | E | 12/1988 | Han et al. |
| 5,143,857 | A | 9/1992 | Finchem et al. |
| 5,276,346 | A | 1/1994 | Iwai et al. |
| 5,395,773 | A | 3/1995 | Ravindhran et al. |
| 5,427,964 | A | 6/1995 | Kaneshiro et al. |
| 5,449,937 | A | 9/1995 | Arimura et al. |
| 5,451,807 | A * | 9/1995 | Fujita .................. 257/404 |
| 5,532,508 | A | 7/1996 | Kaneko et al. |
| 5,763,916 | A | 6/1998 | Gonzalez et al. |
| 5,793,088 | A | 8/1998 | Choi et al. |
| 6,020,611 | A | 2/2000 | Ma et al. |
| 6,127,267 | A | 10/2000 | Matsubara et al. |
| 6,281,062 | B1 | 8/2001 | Sanchez |
| 6,504,211 | B1 | 1/2003 | Gonzalez et al. |
| 6,888,205 | B2 | 5/2005 | Moscatelli et al. |
| 6,958,520 | B2 | 10/2005 | Morifuji |
| 7,157,784 | B2 | 1/2007 | Mitros et al. |
| 7,514,749 | B2 | 4/2009 | Kato et al. |

FOREIGN PATENT DOCUMENTS

| | | |
|---|---|---|
| JP | 2006-80548 A | 3/2006 |
| WO | WO-2009/058187 A1 | 5/2009 |

OTHER PUBLICATIONS

USPTO, (VU) "U.S. Appl. No. 13/451,535 (related)," [CTFR] Final Rejection issued on Aug. 26, 2013.
USPTO, [Vu] Notice of Allowance issued on Jun. 2, 2014, in U.S. Appl. No. 12/882,038 [allowed].
USPTO [Vu] "U.S. Appl. No. 13/451,535 (related)," [CTNF] Non-Final Rejection issued on May 9, 2013 (pending).
USPTO [Lee] "U.S. Appl. No. 12/882,038 (related)," [CTFR] Final Rejection issued on Jun. 11, 2013 (pending).
USPTO, [Lee] Restriction Requirement, Mar 8, 2012, in U.S. Appl. No. 12/882,038 [pending].
USPTO, [Lee] Non-Final Rejection, Apr. 24, 2012, in U.S. Appl. No. 12/882,038 [pending].
USPTO, [Lee] Final Rejection, Sep. 19, 2012, in U.S. Appl. No. 12/882,038 [pending].
USPTO, [Lee] Non-Final Rejection, Jan. 18, 2013, in U.S. Appl. No. 12/882,038 [pending].
USPTO, [Lee], Restriction Requirement, Jan. 30, 2013, in U.S. Appl. No. 13/451,535 [pending].
USPTO, (Vu), Non-Final Rejection issued on Jan. 15, 2015, in U.S. Appl. No. 13/783,296 [pending].

* cited by examiner

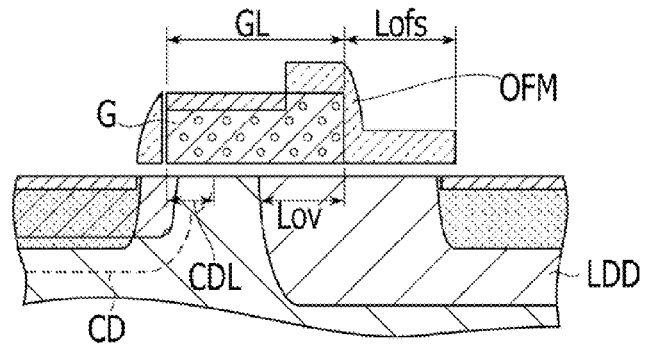
FIG. 5A
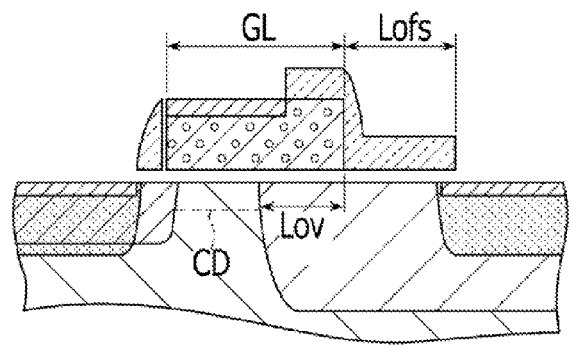
FIG. 5B
FIG. 5C
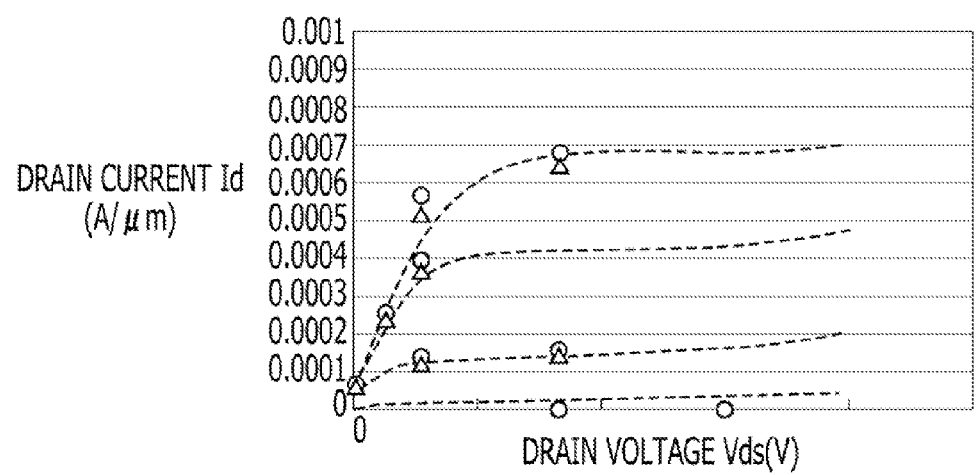

SEMICONDUCTOR DEVICE AND METHOD FOR MANUFACTURING SEMICONDUCTOR DEVICE

CROSS-REFERENCE TO RELATED APPLICATIONS

This application is a divisional of application Ser. No. 13/451,535, filed Apr. 19, 2012, which application is a divisional of application Ser. No. 12/882,038, filed Sep. 14, 2010, which application is based upon and claims the benefit of priority from the prior Japanese Patent Application No. 2009-213189 filed on Sep. 15, 2009, the entire contents of which are incorporated herein by reference.

FIELD

The present invention relates to a semiconductor device and to a method for manufacturing the semiconductor device.

BACKGROUND

In a semiconductor integrated circuit, a MOS transistor that is driven with a higher voltage is often required as well as a MOS transistor that is driven with a low voltage. In cases where an input and output voltage of an external circuit is approximately 3.5 V, a middle breakdown-voltage MOS transistor that is driven with a voltage of approximately 3.5 V is required. Thus, a MOS transistor that is driven with a voltage higher than such a voltage may be required.

In a power amplifier transistor that is mounted in a transmission module of a portable wireless device, input of high radio-frequency (RF) electricity generally causes a voltage output from a drain electrode to be swung in an amount more than approximately double of a bias point. Accordingly, the MOS transistor requires an increased drain breakdown-voltage. A power amplifier mounted in the portable device is generally used in a frequency band in the range from hundreds MHz to several GHz. Accordingly, excellent high-frequency properties are also required at the same time. Not only in the portable device, but also in the power amplifier of high output and high frequency wave, a high breakdown-voltage and excellent high-frequency properties are often required.

In the MOS transistor in which the high breakdown-voltage and the excellent frequency properties are required, reduced on-resistance and an improved gain in the high frequency wave are required. A depletion layer is expanded between an effective channel region in which a gate voltage controls an electric current and a drain region in which a drain electrode has a contact, thereby achieving the high breakdown-voltage. In order to achieve the high breakdown-voltage, employment of a structure of an extended drain (ED) MOS transistor is effective, in which a length of a portion in which a lightly doped drain (LDD) region overlaps a gate electrode is increased with the result that the gate voltage helps the depletion layer to expand.

Even if the depletion layer is expanded, it is required that an effective threshold value is provided to preclude the occurrence of a punch-through-phenomenon. In order to provide the effective threshold value so as to preclude the occurrence of the punch-through-phenomenon, the increase of a dopant concentration in the channel region is effective. However, the uniform increase of the dopant concentration in the channel region likely causes the increase of the on-resistance. In a structure in which lateral distribution of a channel dopant concentration is modulated so as to be lowered toward a drain, the effective threshold value is provided in a region of a high dopant concentration, and a carrier is capable of being accelerated by a built-in electric field due to gradient of the dopant concentration. The on-resistance of the MOS transistor is decreased, and the high radio frequency electricity is likely to be improved. In a laterally diffused (LD) MOS transistor structure in which a channel dopant is added to a source and in which the dopant is thermally diffused in a lateral direction toward a drain, a structure is capable of being provided, in which the channel dopant concentration is gradually reduced from the source to the drain. However, in order to diffuse the dopant for a long distance, annealing is required to be performed at a high temperature for a long time.

There have been attempts to integrate the LDMOS transistor with the MOS transistor of a peripheral circuit. However, such attempts are incompatible with an advanced CMOS process of the 90 nm generation or later. In addition, in cases where the channel dopant concentration is increased in a source region, resistance is likely to be increased in the source.

On the basis of an example as an n-type metal-oxide-semiconductor (NMOS) transistor, Japanese Unexamined Patent Application Publication No. 6-310717 proposes a technique including: forming a gate electrode; implanting an n-type dopant to form an $n^-$-type diffusion layer (extension region) with utilizing the gate electrode as a mask; covering a drain side with a mask; ion-implanting an n-type dopant into a source side to form an n-type diffusion layer in a source side; and rotationally ion-implanting a p-type dopant for forming a channel region at an inclination angle, thereby forming a p-type diffusion layer in the source side in order to cover the n-type diffusion layer in the source side. The p-type diffusion layer in the source side suppresses the expansion of the depletion layer, and therefore the punch-through phenomenon is capable of being suppressed to improve breakdown-voltage between the drain and the source.

In a technique disclosed in Japanese Unexamined Patent Application Publication No. 10-116983, a resist mask is used to perform the ion-implantation of As of the n-type dopant to a region which is included in an n-type silicon substrate and in which LDD will be formed, and then B as the p-type dopant is widely ion-implanted. Each dopant is simultaneously diffused by, for example, thermal diffusion at a temperature of 1200° C. for eight hours, thereby forming a p-type diffusion layer having a low concentration in a p-type well region, the p-type diffusion layer having a reduced effective concentration resulting from compensation of the n-type dopant. Subsequently, the n-type dopant, for example P, is ion-implanted into the p-type diffusion layer having the low concentration and then is thermally diffused at a temperature of 1200° C. for two hours, thereby forming an $n^-$-type drain diffusion layer.

SUMMARY

According to aspects of embodiments, a method for manufacturing a semiconductor device includes forming a first gate electrode on a semiconductor substrate in a first transistor region in which a first transistor of a first conductivity type is to be formed; forming a channel dose region on the semiconductor substrate, the channel dose region is formed by using a first mask as a mask and by ion-implanting a first dopant of the first conductivity type with acceleration energy that passes through the first gate electrode, the channel dose region having a first depth in a source region of the first transistor and having a second depth under the gate electrode, and the first mask covering a drain side of the first gate electrode and covering a drain region of the first transistor, the second depth being shallower than the first depth; and forming a first source extension region in the semiconductor substrate, the first source extension region is formed by using a second mask and by ion-implanting a second dopant of a second conductivity type that is a conductivity type opposite to the first conductivity type, the second mask covering the drain side of the first gate electrode and covering the drain region.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5A is a cross-sectional view illustrating a structure in an example;

FIG. 5B is a cross-sectional view illustrating a structure in a comparative example; and FIG. 5C is a graph illustrating observational results.

DESCRIPTION OF EMBODIMENTS

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present.

FIGS. 1A to 1F are cross-sectional views of a semiconductor substrate and illustrate main processes of a method for manufacturing a semiconductor device according to a first embodiment.

Figure 1A:
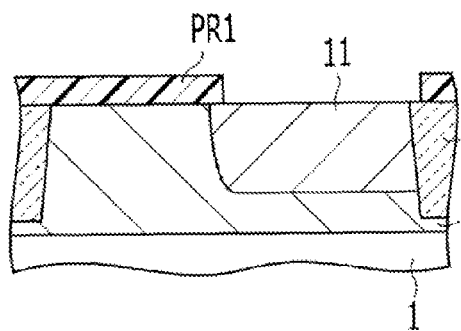
FIG. 1A is a cross-sectional view of a semiconductor substrate and illustrates a main process of a method for manufacturing a semiconductor device according to a first embodiment.

With reference to FIG. 1A, a silicon substrate 1 is etched to form an isolation trench. Then, the isolation trench is filled with an oxide film or the like to form an isolated region STI by shallow trench isolation, thereby defining active regions. Various transistors are formed on a plurality of the active regions. A process for manufacturing an n-channel high breakdown-voltage transistor will be mainly described hereinafter. A p-type dopant, for example B, is ion-implanted into the active region for a high breakdown-voltage transistor with acceleration energy in the range from 100 keV to 200 keV in a dose amount in the range from $2 \times 10^{13}$ (hereinafter described in a manner such as 2E13) to 5E13 ($cm^{-2}$), thereby forming a p-type well PW. In the case of production of a discrete device, this process may be omitted.

A resist mask PR1 is formed on the silicon substrate 1 so as to have an opening in a lightly doped drain (LDD) region. An n-type dopant, for example P, is ion-implanted with acceleration energy in the range from 50 keV to 200 keV in a dose amount in the range from 1E13 to 3E13 ($cm^{-2}$), thereby forming a LDD region 11. The resist mask PR1 is removed, and then annealing is performed, for example, at a temperature of about 1000° C. for 10 seconds to activate the ion-implanted dopant.

Figure 1D:
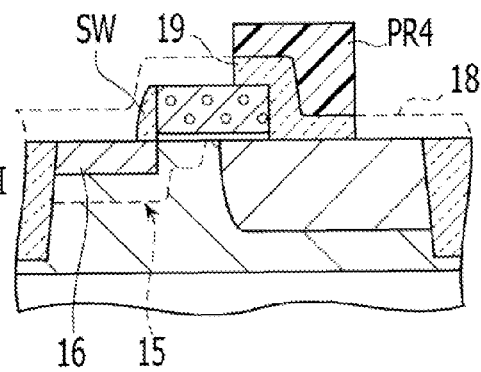
FIG. 1D is the cross-sectional view of the semiconductor substrate and illustrates the main process of the method for manufacturing the semiconductor device according to the first embodiment.
Figure 1B:
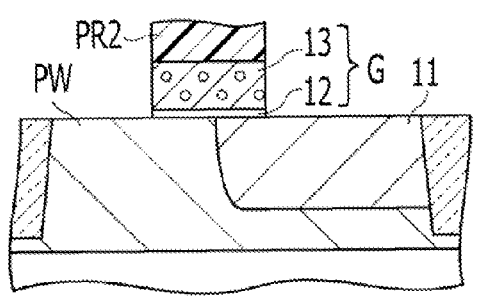
FIG. 1B is the cross-sectional view of the semiconductor substrate and illustrates the main process of the method for manufacturing the semiconductor device according to the first embodiment.

With reference to FIG. 1B, a surface of the active region is thermally oxidized to form a gate insulating film 12 having a thickness of, for example, 7 nm. A polysilicon film 13 is deposited on the gate insulating film 12 by chemical vapor deposition (CVD) so as to have a thickness of, for example, 100 nm. A resist pattern PR2 having the shape of a gate electrode is formed on the polysilicon film 13, and then dry etching is performed by reactive ion etching (RIE) to form the gate electrode G. Subsequently, the resist pattern PR2 is removed.

Figure 1E:
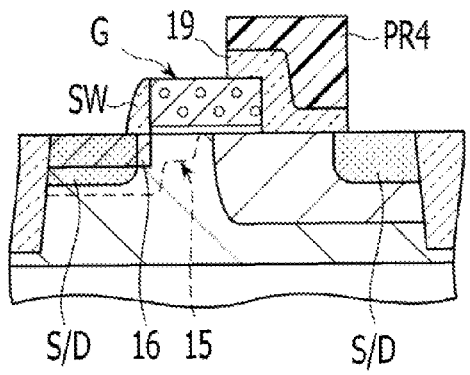
FIG. 1E is the cross-sectional view of the semiconductor substrate and illustrates the main process of the method for manufacturing the semiconductor device according to the first embodiment.
Figure 1C:
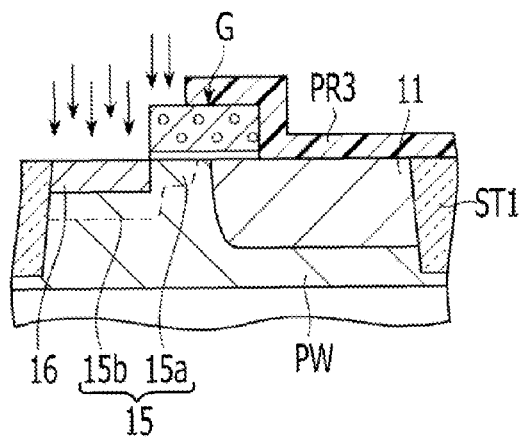
FIG. 1C is the cross-sectional view of the semiconductor substrate and illustrates the main process of the method for manufacturing the semiconductor device according to the first embodiment.

With reference to FIG. 1C, a resist pattern PR3 is formed so as to be opened in a source region and a source side of the gate electrode G (corresponding to a length of a channel dose region) and so as to cover a drain region and a drain side of the gate electrode G. In the embodiment, ion implantation is performed into the channel dose region and an extension region in this state.

For example, in order to form a channel dose region 15, B is ion-implanted as a channel dopant with acceleration energy in the range from 40 keV to 50 keV in a dose amount in the range from 2E12 to 6E12 ($cm^{-2}$), the acceleration energy passing through the gate electrode G. An incidence angle of the ion implantation is in the range from approximately 0° to 7° with respect to a line normal to the substrate. Assuming that ranges in polysilicon, oxide silicon, and single crystal silicon are approximately the same, the depth of the ion implantation in the silicon substrate is smaller under the gate electrode by an amount corresponding to the thickness of the gate electrode as compared with the depth of the ion implantation in a source region in which the gate electrode does not exist. Namely, the channel dose region 15 includes a p-type region 15a, which is a shallow portion under the gate electrode, and includes p-type region 15b, which is a deep portion in the source region. In the p-type region 15b which is the deep portion in the source region, a dopant concentration is low in the vicinity of a surface thereof.

In order to form an extension region 16 as an extension region in the source side, the n-type dopant, for example P, is ion-implanted with energy of, for example, 30 keV in a dose amount of 1E13 ($cm^{-2}$), the energy having a peak at a portion shallower than the channel dose region 15b. Subsequently, the resist pattern PR3 is removed. The ion implantation into the channel dose region 15 and the ion implantation into the extension region 16 may be performed in reverse order.

With reference to FIG. 1D, a silicon oxide film having a thickness of about 10 nm and a silicon nitride film having a thickness of about 30 nm is laminated on the substrate by the CVD so as to cover the gate electrode G, thereby forming an insulating film 18. A resist pattern PR4 is formed on the insulating film 18 so as to extend from a drain side of the gate electrode G onto the drain region in an offset distance (for example, 0.2 µm). Anisotropic etching is performed to the insulating film 18 by the RIE while the resist pattern PR4 is used as an etching mask. A flat portion of the insulating film 18 is etched in a region which is not covered with the resist pattern PR4, and a side wall insulating film SW is left in a source side of the gate electrode G, and an offset mask 19 is left so as to extend from the drain side of the gate electrode G to the drain region in the offset distance.

With reference to FIG. 1E, the n-type dopant, for example P, is ion-implanted with acceleration energy of about 10 keV in a dose amount of about 5E15 ($cm^{-2}$), thereby forming source and drain regions S/D each having a high concentration and a depth. The source region is formed so as to be distanced from the gate electrode G by the thickness of the side wall insulating film SW. The extension region 16 is left under the side wall insulating film SW to form shallow junction. The drain region is formed so as to be distanced from the gate electrode G by the offset distance. Subsequently, the resist pattern PR4 is removed, and annealing is performed at a temperature of about 1000° C. for about one second, thereby activating the dopant.

Figure 1F:
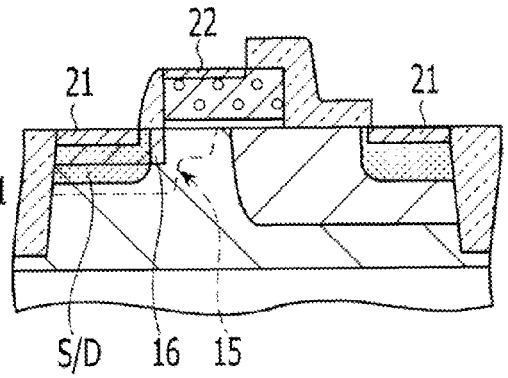
FIG. 1F is the cross-sectional view of the semiconductor substrate and illustrates the main process of the method for manufacturing the semiconductor device according to the first embodiment.

With reference to FIG. 1F, a Ni layer or a Co layer is deposited on the substrate, and the annealing is performed to form silicide layers 21 and 22. An unreactive metal layer is removed by washing out and etching. The silicide layers 21 are individually embedded in the source and drain electrodes, and the silicide layer 22 is embedded in the gate electrode. A high breakdown-voltage MOS transistor is formed in this manner. Subsequently, an interlayer dielectric film and an interconnection are capable of being formed with a typical technique.

Figure 2A:
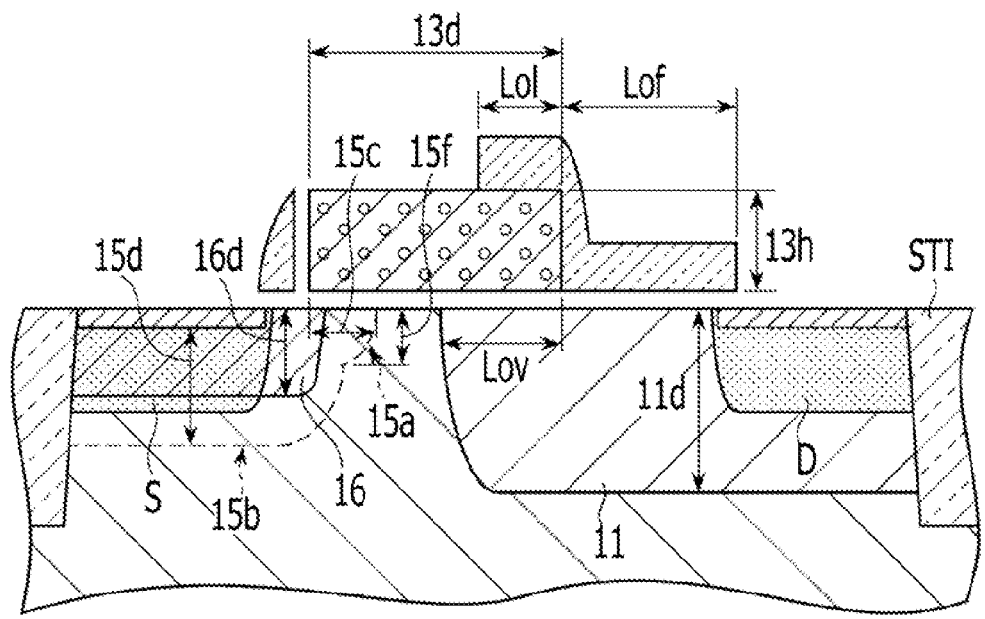
FIG. 2A is a cross sectional view illustrating an example of the semiconductor device according to the first embodiment.

FIG. 2A illustrates a configuration example of the high breakdown-voltage MOS transistor according to the embodiment. For example, the STI has a thickness in the range from 250 nm to 400 nm, and the LDD 11 has a depth 11d in the range from 200 nm to 300 nm, and a distance Lov in which the gate electrode overlaps the LDD 11 is in the range from 100 nm to 300 nm, and the polysilicon film 13 of the gate electrode has a thickness 13h in the range from 80 nm to 120 nm and has a length 13d in the range from 400 nm to 600 nm, and a length Lol in which the offset mask 19 covers the drain side on the gate electrode is in the rage from 10 nm to 100 nm, and an offset distance Lof in which the drain region D of low resistance is offset from an end of the gate electrode G is in the range from 100 nm to 300 nm, and the extension region 16 has a depth 16d in the range from 40 nm to 70 nm, and the channel dose region 15b that is positioned in a source side relative to the gate electrode has a depth 15d in the range from 120 nm to 150 nm, and the channel dose region 15a under the gate electrode has a depth 15f in the range from 20 nm to 50 nm, and a distance 15c in which the channel dose region 15a extends from the source-side end of the gate electrode G under the gate electrode G is in the range from 100 nm to 200 nm, and the depth of each of the high concentration source region S and the high concentration drain region D is in the range from 100 nm to 200 nm.

Figure 2B:
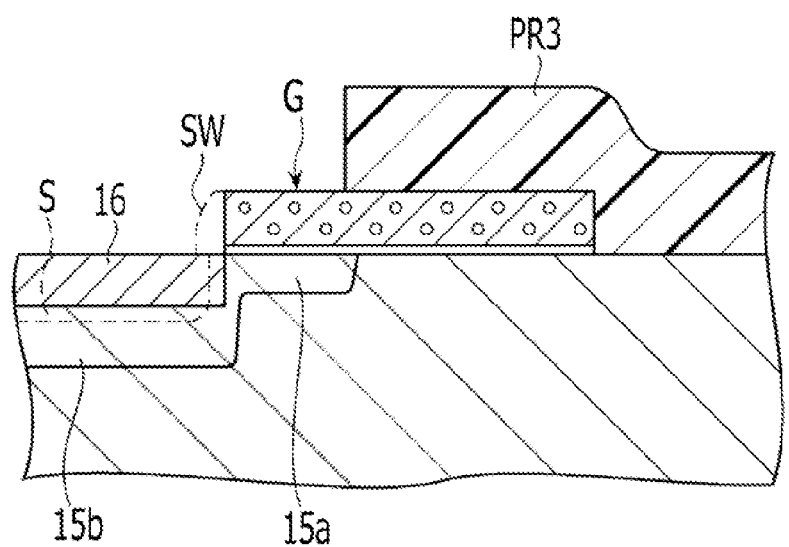
FIG. 2B is a cross sectional view illustrating the shape of distribution of a channel doze region.

With reference to FIG. 2B, the resist pattern PR3 is formed such that the source region and a source-side region of the gate electrode are exposed. Then, ion implantation is performed with acceleration energy that passes through the gate electrode G, thereby forming the channel dose region 15. The channel dose region 15a to which the p-type dopant is added is formed under the gate electrode G, thereby increasing a dopant concentration in the channel region to provide an effective threshold value. The concentration of the p-type dopant is capable of being configured to be sufficiently low in the channel region in a drain side relative to the channel dose region 15a, and therefore a large depletion layer is capable of being formed. Such configurations help the high breakdown-voltage to be provided in conjunction with the LDD region 11 that overlaps the gate electrode.

The channel dose region 15b in the source region is deeply formed so as to have a depth in the range from 120 nm to 150 nm. The dopant concentration is low in a region shallower than a peak position. The extension region 16 has a depth in the range from 40 nm to 70 nm, and the high concentration source region S has a depth in the range from 100 nm to 200 nm. The channel dose region 15b that overlaps such regions has a low dopant concentration. Accordingly, the increase of source resistance due to the distribution of the channel dopant concentration is capable of being suppressed. Because the expansion of the channel dose region 15b during the ion implantation is larger than that of the extension region 16 during the ion implantation, the channel dopant concentration is distributed so as to also cover a side surface of the extension region 16.

The high breakdown-voltage MOS transistor having low on-resistance is capable of being formed in this manner described in the embodiment without annealing at high temperature for long times.

Figure 3:
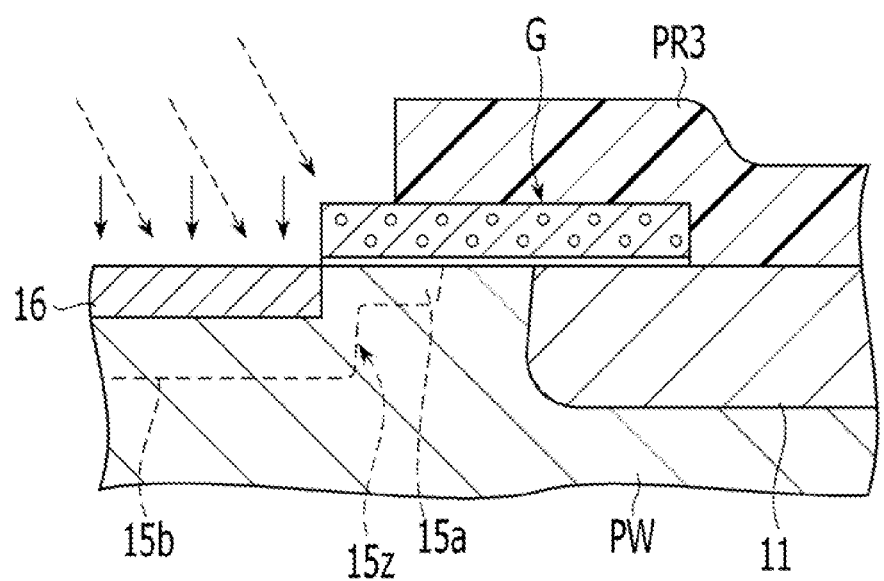
FIG. 3 is a cross-sectional view of a semiconductor substrate and illustrates a method for manufacturing the semiconductor device according to a second embodiment.

FIG. 3 is a perspective view illustrating a method for manufacturing a semiconductor device according to a second embodiment. In the embodiment, a channel dopant is implanted by angled ion implantation. As in the case of the first embodiment, the processes illustrated in FIGS. 1A and 1B are performed. With reference to FIG. 3, the drain side of the gate electrode G and the drain region is covered with the resist pattern PR3. The source-side end of the resist pattern PR3 is positioned so as to be adjacent to the source side for the angled ion implantation as compared with the resist pattern illustrated in FIG. 1C. In this state, the ion implantation is performed to the channel dose region and to the extension region.

For example, B is ion-implanted as the channel dopant with acceleration energy, which passes through the gate electrode G, in the range from 45 keV to 60 keV in a dose amount in the range from 3E12 to 1E13 (cm$^{-2}$) in a direction that is tilted from a line normal to the substrate to a side of the source region at an angle in the range from 20° to 45°, for example 30°. As in the case of the first embodiment, the shallow p-type region 15$a$ and the deep p-type region 15$b$ are formed. A side wall 15$z$ that is a stepped portion of the channel dose region 15 is formed such that a side wall of the gate electrode G is transferred. Assuming that incidence angle of ion is θ and that a range is f, the side wall 15$z$ is capable of being positioned toward the inside of the channel region relative to a position of the side wall of the gate electrode by an amount represented by g=f sin θ.

The ion implantation into the extension region 16 is performed approximately along the line normal to the substrate as in the case of the first embodiment. In order to form the extension region 16, the n-dopant, for example P, is ion-implanted with energy of, for example, 30 keV in a dose amount of about 1E13 (cm$^{-2}$), the energy having a peak at a position shallower than the channel dose region 15$b$. An end of the extension region 16 is formed such that a side wall of the gate electrode G is transferred. Subsequently, the resist pattern PR3 is removed. Obviously, the ion implantation into the channel dose region and the ion implantation into the extension region may be performed in reverse order. Then, the processes the same as those illustrated in FIGS. 1D to 1F are performed, thereby completing the high breakdown-voltage MOS transistor.

By virtue of the embodiment, the channel dose region is capable of being appropriately positioned toward the inside of the channel. Accordingly, the edge of the extension region 16 is covered with the channel dose region 15 having a sufficient thickness of, for example, greater than or equal to approximately 70 nm, thereby suppressing the punch-through phenomenon. For example, in cases where B is implanted at an incidence angle of about 30° in a depth of about 120 nm, a relationship of 120*tan(30°)≈70 is provided.

In a portable wireless device, various MOS transistors are required to be integrated on a single silicon chip. For example, a middle breakdown-voltage transistor used for input and output (I/O) of a voltage of about 3.5 V is integrated with a low breakdown-voltage transistor used for a logic circuit as well as a high breakdown-voltage transistor used for a power amplifier. FIGS. 4A to 4I are perspective views illustrating main processes of a method for manufacturing a semiconductor device according to a third embodiment.

Figure 4A:
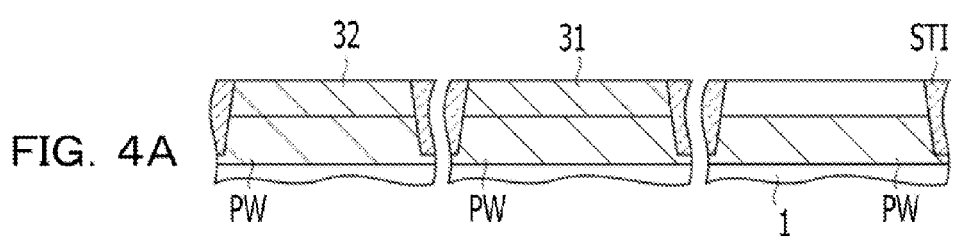
FIG. 4A is a cross-sectional view of a semiconductor substrate and illustrates a main process of the method for manufacturing the semiconductor device according to a third embodiment.

With reference to FIG. 4A, the isolated region STI is formed on the substrate 1 by the shallow trench isolation, thereby defining active regions. The active region in a left side is a core transistor region, and the middle active region is an I/O transistor region, and the active region in a right side is a high breakdown-voltage transistor region. In this case, an example of formation of an n-channel transistor will be described. The p-type dopant, for example B, is ion-implanted into each of the active regions with acceleration energy in the range from 100 keV to 200 keV in a dose amount in the range from 2E13 to 5E13 (cm$^{-2}$), thereby forming the p-type well PW.

The I/O transistor region is exposed inside an opening of a resist mask, and the p-type dopant, for example B, is ion-implanted with acceleration energy in the range from 30 keV to 40 keV in a dose amount in the range from, for example, 3E12 to 6E12 (cm$^{-2}$), thereby forming a channel dose region 31 of the I/O transistor. The core transistor is exposed inside another opening of the resist mask, and the p-type dopant, for example B, is ion-implanted with acceleration energy in the range from 15 keV to 25 keV in a dose amount in the range from, for example, 1E13 to 3E13 (cm$^{-2}$), thereby forming a channel dose region 32 of the core transistor.

Figure 4B:
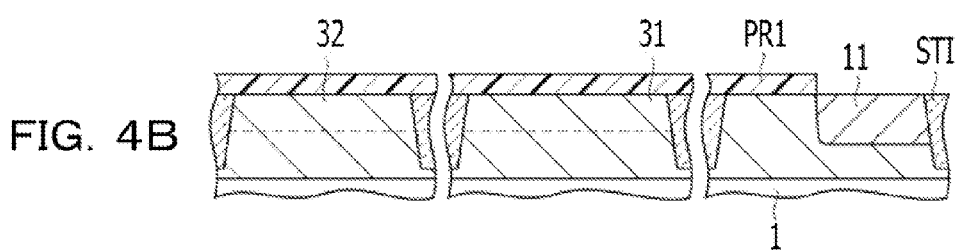
FIG. 4B is the cross-sectional view of the semiconductor substrate and illustrates the main process of the method for manufacturing the semiconductor device according to the third embodiment.

With reference to FIG. 4B, the resist pattern PR1 is formed so as to cover the core transistor region, the I/O transistor region, and the high breakdown-voltage transistor region other than a LDD region. For example, P is ion-implanted with acceleration energy in the range from 50 keV to 200 keV in a dose amount in the range from 1E13 to 3E13 (cm$^{-2}$), thereby forming the LDD region 11. Subsequently, the resist pattern PR1 is removed, and then annealing is performed at a temperature of about 1000° C. for about 10 seconds to activate the dopant, thereby dispersing the dopant. This process corresponds to the process illustrated in FIG. 1A.

Figure 4C:
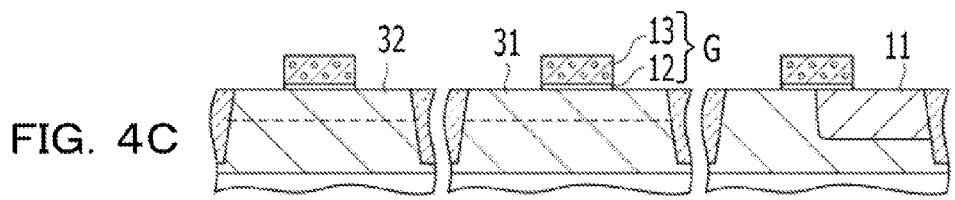
FIG. 4C is the cross-sectional view of the semiconductor substrate and illustrates the main process of the method for manufacturing the semiconductor device according to the third embodiment.

With reference to FIG. 4C, a surface of the active region is thermally oxidized to form a gate insulating film 12 having a thickness of, for example, 7 nm. A polysilicon film 13 is deposited on the gate insulating film 12 by the CVD so as to have a thickness of, for example, 100 nm. A resist pattern having the shape of a gate electrode is formed on the polysilicon film 13, and then the polysilicon film 13 and the gate insulating film 12 are etched to form the gate electrode G. Subsequently, the resist pattern is removed. This process corresponds to the process illustrated in FIG. 1B.

Figure 4D:
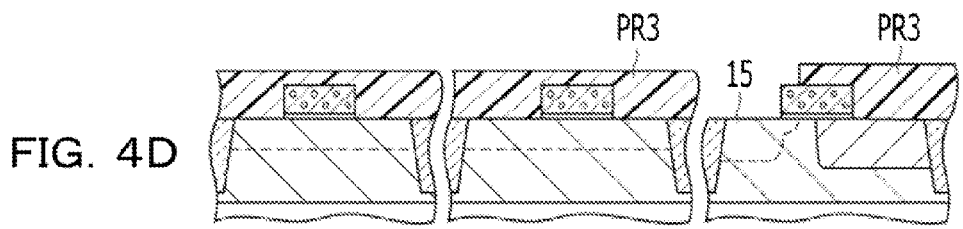
FIG. 4D is the cross-sectional view of the semiconductor substrate and illustrates the main process of the method for manufacturing the semiconductor device according to the third embodiment.

With reference to FIG. 4D, the resist mask PR3 is formed so as to have openings in the source region of the high breakdown-voltage transistor and in a predetermined region of a source side of the gate electrode G. The channel dopant for the high breakdown-voltage transistor is ion-implanted with acceleration energy that passes through the exposed gate electrode G. For example, as in the case of the process illustrated in FIG. 1C in the first embodiment, B is ion-implanted as the p-type dopant with acceleration energy in the range from 40 keV to 50 keV in a dose amount in the range from 2E12 to 6E12 (cm$^{-2}$) in a substantially vertical direction, thereby forming the channel dose region 15. Alternatively, as in the case of the process illustrated in FIG. 3 in the second embodiment, for example, B is ion-implanted with acceleration energy in the range from 45 keV to 60 keV in a dose amount in the range from 3E12 to 1E13 (cm$^{-2}$) in a direction that is tilted from a line normal to the substrate at an angle in the range from 20° to 45°, for example 30°. The ion implantation of the channel dopant into the high breakdown-voltage transistor is not limited to the above manner. Preferably, for example, B is ion-implanted with acceleration energy in the range from 30 keV to 50 keV in a dose amount in the range from 1E12 to 5E12 ($cm^{-2}$). Subsequently, the resist pattern PR3 is removed.

A pocket region of the core transistor that will be subsequently formed also surrounds the extension region and has an opposite conductivity type. Comparing the both regions, the channel dose region of the high breakdown-voltage transistor has a depth that is at least twice as small as the depth of the pocket region and has a dose amount that is approximately an order of magnitude lower than that of the pocket region.

Figure 4E:
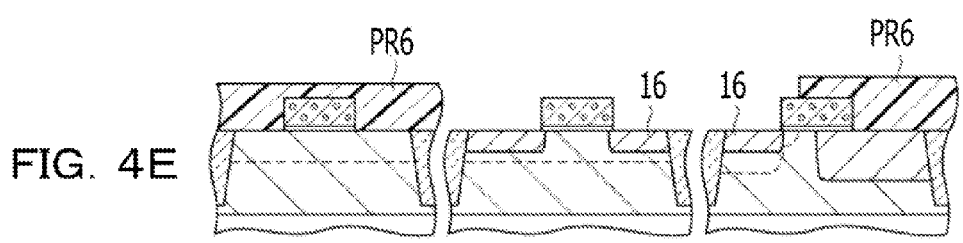
FIG. 4E is the cross-sectional view of the semiconductor substrate and illustrates the main process of the method for manufacturing the semiconductor device according to the third embodiment.

With reference to FIG. 4E, a resist pattern PR6 is newly formed so as to open in an entire region of the middle breakdown-voltage transistor and so as to open a source-side region of the high breakdown-voltage transistor. In order to form the extension region 16, P is ion-implanted as the n-type dopant with acceleration energy of, for example, 30 keV in a dose amount of about 1E13 ($cm^{-2}$), the acceleration energy having a peak at a position shallower than the channel dose region. Subsequently, the resist pattern PR6 is removed. The individual processes of FIGS. 4D and 4E may be performed in reverse order.

In the first and second embodiments, the ion implantation is performed into the channel dose region and into the extension region by using substantially the same resist patterns. On the other hand, in this embodiment, the ion implantation into the channel dose region is performed to the high breakdown-voltage transistor, and the ion implantation into the extension region is performed to both the middle breakdown-voltage transistor and the high breakdown-voltage transistor, and therefore different masks are formed.

Figure 4F:
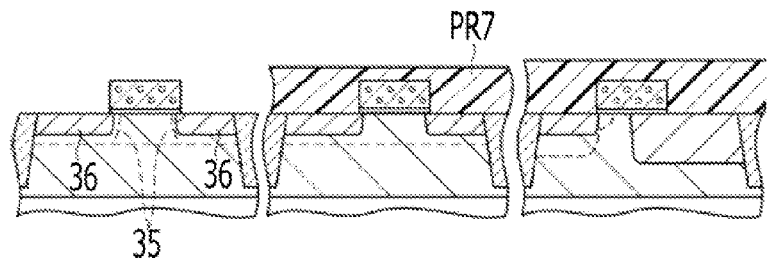
FIG. 4F is the cross-sectional view of the semiconductor substrate and illustrates the main process of the method for manufacturing the semiconductor device according to the third embodiment.

With reference to FIG. 4F, a resist pattern PR7 is formed so as to open in the region of the low breakdown-voltage core transistor. For example, B is ion-implanted with acceleration energy of 10 keV in a dose amount in the range from 1E13 to 5E13 ($cm^{-2}$) in four directions that are tilted from the line normal to the substrate at angles in the range from 25° to 45°, thereby forming a pocket region 35. For example, As is ion-implanted with acceleration energy in the range from 1 keV to 5 keV in a dose amount in the range from 1E15 to 3E15 ($cm^{-2}$) in a direction that is tilted from the line normal to the substrate at an angle from 0° to 7°, thereby forming an extension region 36. The extension region 36 is provided so as to be wrapped by the pocket region 35. Subsequently, the resist pattern PR7 is removed. As described above, the ion-implanted pocket region has a depth that is less than or substantially equal to half the depth of the ion-implanted channel dose region and has a dose amount that is an order of magnitude higher than that of the ion-implanted channel dose region. Even if conditions are changed, the ion-implanted pocket region generally has the depth that is less than or substantially equal to half the depth of the ion-implanted channel dose region and generally has a dose amount that is greater than or substantially equal to five times the depth of the ion implanted channel dose region.

Figure 4G:
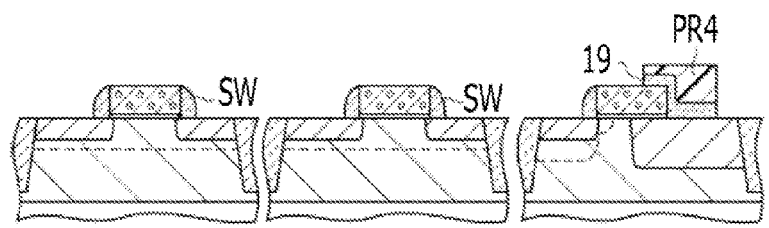
FIG. 4G is the cross-sectional view of the semiconductor substrate and illustrates the main process of the method for manufacturing the semiconductor device according to the third embodiment.

With reference to FIG. 4G, for example, a silicon oxide film having a thickness of about 10 nm and a silicon nitride film having a thickness of about 30 nm is laminated on the silicon substrate by the CVD so as to cover the gate electrode G, thereby forming an insulating film. A resist pattern PR4 for offset is formed on the insulating film so as to extend from a drain side of the gate electrode G of the high breakdown-voltage transistor to the drain region in a predetermined distance (offset distance). Anisotropic etching is performed to the insulating film, thereby forming side wall spacers SW and the offset mask 19. This process corresponds to the process illustrated in FIG. 1D.

Figure 4H:
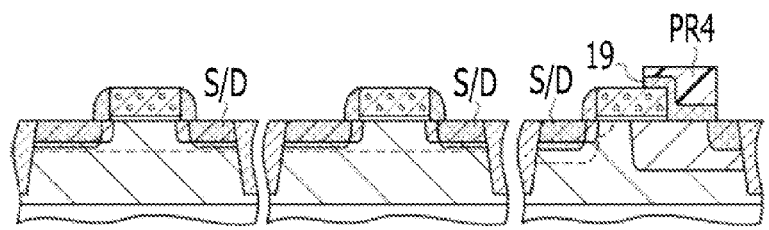
FIG. 4H is the cross-sectional view of the semiconductor substrate and illustrates the main process of the method for manufacturing the semiconductor device according to the third embodiment.

With reference to FIG. 4H, the n-type dopant, for example P, is ion-implanted with acceleration energy of, for example, 10 keV in a dose amount of about 5E15 ($cm^{-2}$), thereby forming source and drain regions S/D having high concentration and low resistance. Subsequently, the resist pattern PR4 is removed, and annealing is performed at a temperature of about 1000° C. for one second, thereby activating the dopant. This process corresponds to the process illustrated in FIG. 1E.

Figure 4I:
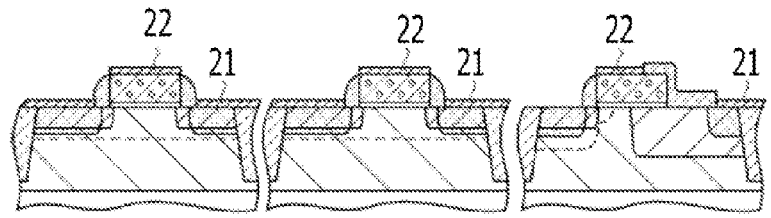
FIG. 4I is the cross-sectional view of the semiconductor substrate and illustrates the main process of the method for manufacturing the semiconductor device according to the third embodiment.

With reference to FIG. 4I, a silicide region is formed. For example, a nickel silicide film or a cobalt silicide film is formed. This process corresponds to the process illustrated in FIG. 1F. Meanwhile, although an NMOS transistor has been described as an example, the reverse of a conductivity type enables a PMOS transistor to be produced. The NMOS transistor and the PMOS transistor are selectively processed by using a resist pattern. The NMOS transistor and the PMOS transistor are formed, thereby forming a CMOS circuit.

As illustrated in FIG. 5A, an example of the high breakdown-voltage transistor according to the first embodiment was manufactured. For example, the gate electrode G was configured so as to have a gate length of about 440 nm in a direction of a channel length. The lightly doped drain region LDD overlapped the gate electrode G in an overlap length Lov of about 120 nm. A channel dose region CD under the gate electrode G was configured so as to have a channel dose length CDL of, for example, 120 nm in the direction of the channel length. An offset mask OFM covered the drain-side region of the gate electrode G in a length of, for example, 100 nm and extended from a drain-side side wall of the gate electrode G onto the drain region in a length of, for example, 190 nm.

FIG. 5B illustrates a comparative example that was manufactured for comparison. In the comparison example, the channel dose region CD was not formed in a source-side region under the gate and in a source region and was formed in the entire active region. The configuration of the comparative example was substantially the same as that of the example illustrated in FIG. 5A except such a point.

FIG. 5C is a graph illustrating relationships between characteristics of drain voltages and drain currents in the example and comparative example. A lateral axis indicates the drain voltages (source-drain voltages) Vds on the basis of a unit of V, and a longitudinal axis indicates the drain currents Id on the basis of a unit of A/μm. In the case of Vg=0 V, 1.1 V, 2.2 V, 3.3 V, measured values in the example are indicated by white circles, and measured values in the comparative example are indicated by white triangles. Reference current-voltage characteristics (I-V characteristics) are indicated by a dashed line in the gate voltages of 0.55 V. 1.1 V, 2.2 V, 3.3 V. In the case of Vds=1.1 V and Vg=3.3 V, the drain voltages in the example are highly improved relative to those in the comparative example.

As described above, the high breakdown-voltage transistor of low on-resistance is capable of being formed without annealing at high temperature for long times, the high breakdown-voltage transistor being provided so as to be able to be integrated with an advanced CMOS transistor. The source-side channel dose region of the high breakdown-voltage transistor has a peak of the dopant concentration at deep portion. Therefore, parasitic resistance in the source side is capable of being reduced, and the on-resistance is capable of being reduced.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. A method for manufacturing a semiconductor device comprising:

forming a first gate electrode on a semiconductor substrate in a first transistor region in which a first transistor of a first conductivity type is to be formed;

forming a channel dose region on the semiconductor substrate, the channel dose region is formed by using a first mask as a mask and by ion-implanting a first dopant of the first conductivity type with acceleration energy that passes through the first gate electrode, the channel dose region having a first depth in a source region of the first transistor and having a second depth under the gate electrode, and the first mask covering a drain side of the first gate electrode and covering a drain region of the first transistor, the second depth being shallower than the first depth;

forming a first source extension region in the semiconductor substrate, the first source extension region is formed by using a second mask and by ion-implanting a second dopant of a second conductivity type that is a conductivity type opposite to the first conductivity type, the second mask covering the drain side of the first gate electrode and covering the drain region;

preparing the semiconductor substrate having a second transistor region in which a second transistor of the first conductivity type is to be formed and having a third transistor region in which a third transistor of the first conductivity type is to be formed;

forming a second gate electrode in the second transistor region; and forming a third gate electrode in the third transistor region, wherein the first mask covers the second transistor region and the third transistor region, and the second mask does not cover the second transistor region.

2. The method for manufacturing the semiconductor device according to claim 1, wherein the first mask and the second mask are the same mask.

3. The method for manufacturing the semiconductor device according to claim 1, further comprising:

forming a pocket region in the semiconductor substrate, the pocket region is formed by using a third mask and by obliquely ion-implanting a third dopant of the first conductivity type into the third transistor region, the third mask covering the second transistor region and covering the first transistor region, and the third gate electrode being positioned in the third transistor region, and forming a third source extension region in the semiconductor substrate, the third source extension region is formed by using the third mask and by ion-implanting a fourth dopant of the second conductivity type into the third transistor region at a peak position shallower than the pocket region, the third gate electrode being positioned in the third transistor region.

4. The method for manufacturing the semiconductor device according to claim 3, wherein the ion implantation into the pocket region has a depth that is less than or equal to half a depth of the ion implantation into the channel dose region and has a dose amount that is greater than or equal to five times a dose amount of the ion implantation into the channel dose region.

* * * * *